(12) United States Patent
Ukon

(10) Patent No.: US 11,523,499 B2
(45) Date of Patent: Dec. 6, 2022

(54) FLEXIBLE WIRING BOARD

(71) Applicant: KYOCERA Corporation, Kyoto (JP)

(72) Inventor: Akira Ukon, Akashi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/174,501

(22) Filed: Feb. 12, 2021

(65) Prior Publication Data

US 2021/0289616 A1 Sep. 16, 2021

(30) Foreign Application Priority Data

Mar. 12, 2020 (JP) .............................. JP2020-043411

(51) Int. Cl.
*H05K 1/02* (2006.01)

(52) U.S. Cl.
CPC .............. *H05K 1/025* (2013.01); *H05K 1/028* (2013.01)

(58) Field of Classification Search
CPC ...... H05K 1/025; H05K 1/028; H05K 1/0219; H05K 1/0393; H05K 1/118; H05K 1/144; H05K 1/189; H05K 1/11; H05K 2201/05; H05K 2201/09236
See application file for complete search history.

(56) References Cited

U.S. PATENT DOCUMENTS

| | | | | |
|---|---|---|---|---|
| 5,164,692 A * | 11/1992 | Gertel | ................. | H05K 1/0219 333/33 |
| 5,300,899 A * | 4/1994 | Suski | ................... | H05K 1/0253 174/254 |
| 8,058,943 B2 * | 11/2011 | Lee | ......................... | H01P 3/003 333/24 R |
| 10,014,565 B2 * | 7/2018 | Kurokawa | ............... | H01P 3/08 |
| 2009/0065238 A1 * | 3/2009 | Liu | ...................... | H05K 1/0245 174/250 |
| 2014/0014409 A1 * | 1/2014 | Lin | ....................... | H05K 1/117 174/75 R |

FOREIGN PATENT DOCUMENTS

| | | | | |
|---|---|---|---|---|
| JP | 2001144451 A | * | 5/2001 | |
| JP | 2006024618 A | * | 1/2006 | |
| JP | 2009124044 A | * | 6/2009 | |
| JP | 2015-046714 A | | 3/2015 | |

OTHER PUBLICATIONS

JP-2006024618-A (Year: 2021).*
JP-2001144451-A (Year: 2021).*
JP-2009124044-A (Translation) (Year: 2022).*

* cited by examiner

*Primary Examiner* — Hoa C Nguyen
*Assistant Examiner* — John B Freal
(74) *Attorney, Agent, or Firm* — Studebaker & Brackett PC

(57) ABSTRACT

A flexible wiring board includes a layer including an impedance control line capable of transmitting a high frequency signal and a conductive layer including a conductor positioned along the impedance control line. The flexible wiring board is capable of transmitting high frequency signals well.

11 Claims, 6 Drawing Sheets

FLEXIBLE WIRING BOARD

CROSS-REFERENCE TO RELATED APPLICATION

The present application claims priority to Japanese Patent Application No. 2020-43411 filed Mar. 12, 2020, the entire contents of which are incorporated herein by reference.

TECHNICAL FIELD

The present disclosure relates to a flexible wiring board.

BACKGROUND

In a rigid printed wiring board, a transmission line such as a coplanar line or a microstrip line is sometimes used for transmitting a high frequency signal. The transmission line disclosed in patent literature (PTL) 1, for example, has a microstrip line formed on one signal line and a microstrip or a coplanar line formed on another signal line. To transmit a high frequency signal with low loss between a plurality of transmission lines, impedance matching is preferably secured between the transmission lines.

CITATION LIST

Patent Literature

PTL 1: JP 2015-046714 A

SUMMARY

A flexible wiring board according to an embodiment includes:

at least one layer including an impedance control line capable of transmitting a high frequency signal; and at least one conductive layer including a conductor positioned along the impedance control line.

DETAILED DESCRIPTION

Figure 1:
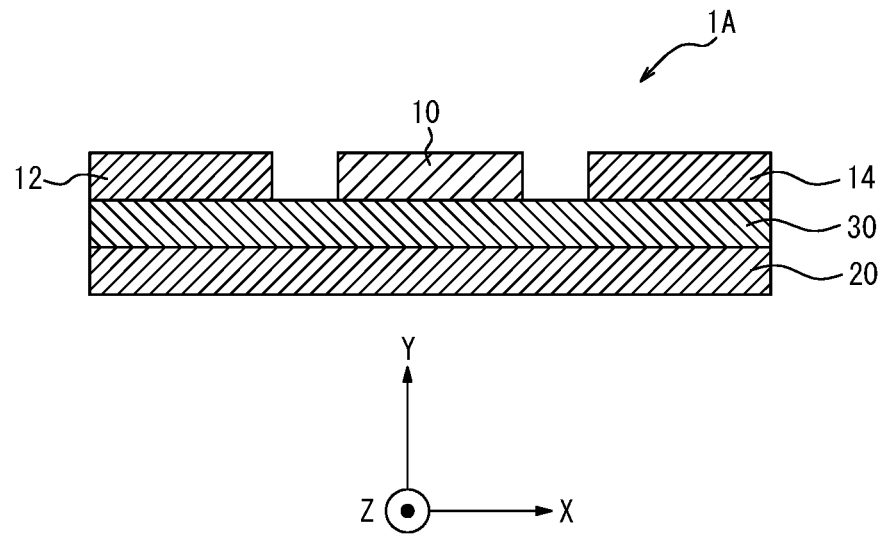
FIG. 1 illustrates a cross-section of a flexible wiring board according to an embodiment.

As compared to rigid printed wiring boards, flexible printed wiring boards are flexible or bendable. High frequency signals can preferably be transmitted well also when using such flexible wiring boards. It would be helpful to provide a flexible wiring board capable of transmitting high frequency signals well. According to an embodiment, a flexible wiring board capable of transmitting high frequency signals well can be provided. A flexible wiring board according to an embodiment is described below with reference to the drawings.

In the present disclosure, the term "flexible wiring board" may, for example, encompass flexible printed boards, flexible printed wiring boards, flexible printed circuit boards (flexible printed circuits, or FPC), flexible flat cables (FFC), and the like. In the present disclosure, the term "flexible wiring board" may typically refer to a concept opposed to a rigid board. The term "flexible wiring board" in the present disclosure may, however, encompass rigid flexible boards, flexible rigid boards, and the like.

An impedance control line used in a known RF circuit (high frequency circuit) is usually configured using a rigid board. Such a rigid board is sometimes structured as a strip line, a microstrip line, a coplanar line, or the like. By the use of planar waveguide technology, these structures are made capable of transmitting high frequency signals. In these structures, at least a portion of the area around the signal line is commonly surrounded by ground (GND).

These rigid boards are often formed from hard resin, however, and tend to have poor flexibility or bendability. Constraints may therefore be placed on the rigid boards during product design, such as exclusion from use in a moving or sliding portion of a housing. A flexible wiring board is therefore adopted in the embodiment described below to flexibly address structural constraints.

FIGS. 1 through 5 each illustrate a cross-section of a flexible wiring board according to an embodiment. The x-axis direction indicated in the drawings below may be the direction indicating the "width" of the flexible wiring board according to an embodiment. The y-axis direction indicated in the drawings below may be the direction indicating the "thickness" of the flexible wiring board according to an embodiment. The z-axis direction indicated in the drawings below may be the direction indicating the "length" of the flexible wiring board according to an embodiment. In other words, the flexible wiring board illustrated in the drawings below may be a flexible wiring board elongated in a direction parallel to the z-axis direction.

In the coordinate system illustrated in the drawings below, the positive side of the x-axis is also indicated as "right" and the negative side of the x-axis as "left" as appropriate. In the coordinate system illustrated in the drawings below, the positive side of the y-axis is also indicated as "up" and the negative side of the y-axis as "down" as appropriate. In the coordinate system illustrated in the drawings below, the positive side of the z-axis is also indicated as "front" and the negative side of the y-axis as "back" as appropriate.

FIG. 1 illustrates a cross-section, parallel to the x-y plane, of a flexible wiring board 1A according to an embodiment. The flexible wiring board 1A illustrated in FIG. 1 can transmit a signal in a direction parallel to the z-axis. As illustrated in FIG. 1, the flexible wiring board 1A according to an embodiment may have a structure with at least two layers (three layers in FIG. 1) overlapping in the y-axis direction.

As illustrated in FIG. 1, the flexible wiring board 1A according to an embodiment may include an impedance control line 10, a first ground line 12, a second ground line 14, a ground layer 20, and an insulation layer 30.

The impedance control line 10 may be configured to be capable of transmitting a high frequency signal (RF signal). The impedance control line 10 may be configured by a thin film conductor. Hereinafter, the members configured by a "conductor" may be configured by any appropriate conductive material, such as copper. The thickness of the impedance control line 10 may, for example, be approximately from 12 μm to 50 μm. The impedance control line 10 may have length in a direction parallel to the z-axis direction illustrated in the drawings. As illustrated in FIG. 1, the impedance control line 10 may be disposed above the ground layer 20 with the insulation layer 30 therebetween.

The first ground line 12 and the second ground line 14 may be lines that function as a ground (GND). Like the impedance control line 10, the first ground line 12 and the second ground line 14 may be configured by a thin film conductor. The thickness of the first ground line 12 and the second ground line 14 may, for example, be approximately from 12 μm to 50 μm. The first ground line 12 and the second ground line 14 may have length in a direction parallel to the z-axis direction illustrated in the drawings. As illustrated in FIG. 1, the first ground line 12 may be positioned on the left side of the impedance control line 10. The second ground line 14 may be positioned on the right side of the impedance control line 10. As illustrated in FIG. 1, the first ground line 12 and the second ground line 14 may be disposed above the ground layer 20 with the insulation layer 30 therebetween, like the impedance control line 10.

The ground layer 20 may be a layer that functions as a ground (GND). Like the first ground line 12 and the second ground line 14, the ground layer 20 may be configured by a thin film conductor. The thickness of the ground layer 20 may, for example, be approximately from 12 μm to 50 μm. The ground layer 20 may have length in a direction parallel to the z-axis direction illustrated in the drawings. As illustrated in FIG. 1, the ground layer 20 may be positioned to cover the impedance control line 10, along with the first ground line 12 and the second ground line 14, from below with the insulation layer 30 therebetween.

The insulation layer 30 may be a layer having a function of insulating between layers. The insulation layer 30 may be configured by a thin film conductor. Hereinafter, the members configured by an "insulator" may be configured by any appropriate insulating material, such as polyimide or polyester. The thickness of the insulation layer may, for example, be approximately from 12 μm to 50 μm. The insulation layer 30 may have length in a direction parallel to the z-axis direction illustrated in the drawings. As illustrated in FIG. 1, the insulation layer 30 may be positioned with the impedance control line 10, the first ground line 12, and the second ground line 14 on one side and the ground layer 20 on the other.

An adhesive layer between each of the layers, for example as in FIG. 1, may be formed from any appropriate material, such as an epoxy resin-based or acrylic resin-based adhesive, prepreg, or the like.

With the configuration illustrated in FIG. 1, the flexible wiring board 1A according to an embodiment can have the same function as a coplanar line formed on a rigid board. In other words, the flexible wiring board 1A according to an embodiment can transmit a high frequency signal well on the impedance control line 10. The flexible wiring board 1A according to an embodiment is flexible or bendable and can therefore be curved for use in a moving or sliding portion of a housing, for example. Structural constraints during product design can therefore flexibly be addressed. In this way, the flexible wiring board 1A according to an embodiment enables formation of an impedance control line on a flexible board.

Figure 2:
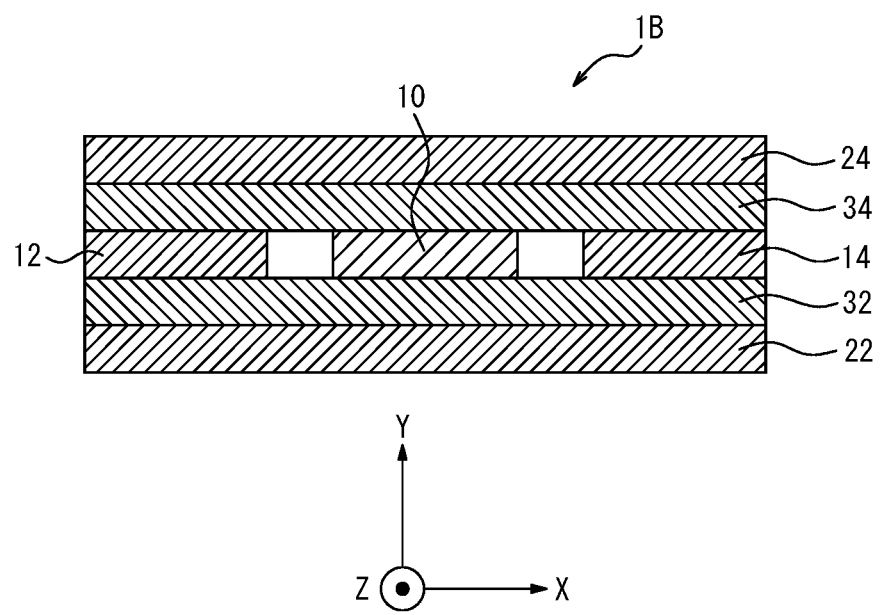
FIG. 2 illustrates a cross-section of a flexible wiring board according to an embodiment.

FIG. 2 illustrates a cross-section, parallel to the x-y plane, of a flexible wiring board 1B according to an embodiment. The flexible wiring board 1B illustrated in FIG. 2 can transmit a signal in a direction parallel to the z-axis. As illustrated in FIG. 2, the flexible wiring board 1B according to an embodiment may have a structure with at least two layers (five layers in FIG. 2) overlapping in the y-axis direction.

As illustrated in FIG. 2, the flexible wiring board 1B according to an embodiment is similar to the flexible wiring board 1A illustrated in FIG. 1 by including an impedance control line 10, a first ground line 12, and a second ground line 14. In the flexible wiring board 1B according to an embodiment, the configuration and arrangement of the impedance control line 10, the first ground line 12, and the second ground line 14 may be similar to those of the flexible wiring board 1A illustrated in FIG. 1. The flexible wiring board 1B illustrated in FIG. 2 may include a first ground layer 22 and second ground layer 24, and a first insulation layer 32 and second insulation layer 34.

The first ground layer 22 and the second ground layer 24 may have a configuration similar to that of the ground layer 20 illustrated in FIG. 1. As illustrated in FIG. 2, the first ground layer 22 may be positioned to cover the impedance control line 10, along with the first ground line 12 and the second ground line 14, from below with the first insulation layer 32 therebetween. As also illustrated in FIG. 2, the second ground layer 24 may be positioned to cover the impedance control line 10, along with the first ground line 12 and the second ground line 14, from above with the second insulation layer 34 therebetween.

The first insulation layer 32 and the second insulation layer 34 may have a configuration similar to that of the insulation layer 30 illustrated in FIG. 1. As illustrated in FIG. 2, the first insulation layer 32 may be positioned with the impedance control line 10, the first ground line 12, and the second ground line 14 on one side and the first ground layer 22 on the other. As also illustrated in FIG. 2, the second insulation layer 34 may be positioned with the impedance control line 10, the first ground line 12, and the second ground line 14 on one side and the second ground layer 24 on the other.

With the configuration illustrated in FIG. 2, the flexible wiring board 1B according to an embodiment can have the same function as a strip line configured on a rigid board. In other words, the flexible wiring board 1B according to an embodiment can transmit a high frequency signal well on the impedance control line 10. The flexible wiring board 1B according to an embodiment is flexible or bendable and can therefore be curved for use in a moving or sliding portion of a housing, for example. Structural constraints during product design can therefore flexibly be addressed. In this way, the flexible wiring board 1B according to an embodiment enables formation of an impedance control line on a flexible board.

Figure 3:
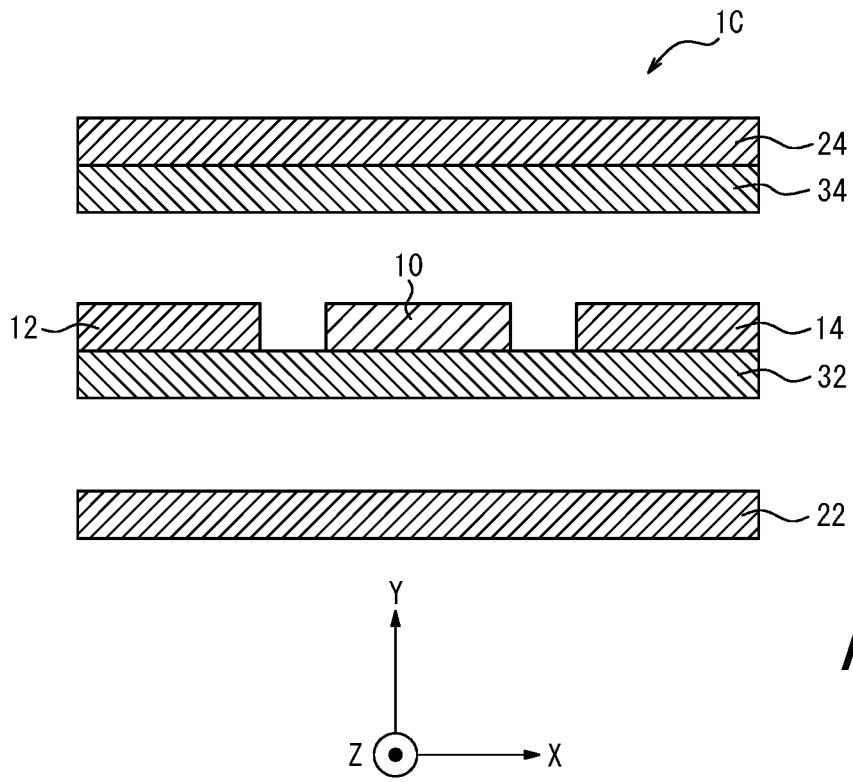
FIG. 3 illustrates a cross-section of a flexible wiring board according to an embodiment.

FIG. 3 illustrates a cross-section, parallel to the x-y plane, of a flexible wiring board 1C according to an embodiment. The flexible wiring board 1C illustrated in FIG. 3 can transmit a signal in a direction parallel to the z-axis. As illustrated in FIG. 3, the flexible wiring board 1C according to an embodiment may include a structure with at least two layers (two layers in FIG. 3) overlapping in the y-axis direction.

As illustrated in FIG. 3, the flexible wiring board 1C according to an embodiment is configured like the flexible wiring board 1B illustrated in FIG. 2, but with several layers separated from each other. In other words, the flexible wiring board 1C illustrated in FIG. 3 may be configured like the flexible wiring board 1B illustrated in FIG. 2, but with the first ground layer 22 and the first insulation layer 32 separated from each other. The flexible wiring board 1C illustrated in FIG. 3 may also be configured like the flexible wiring board 1B illustrated in FIG. 2, but with the impedance control line 10, the first ground line 12, and the second ground line 14 separated from the second insulation layer 34.

With the configuration illustrated in FIG. 3, the flexible wiring board 1C according to an embodiment can have better flexibility or bendability than the flexible wiring board 1A illustrated in FIG. 1 and the flexible wiring board 1B illustrated in FIG. 2. For example, if a multilayer structure like the flexible wiring board 1B illustrated in FIG. 2 is bent overall, the difference in distance between the outermost layer and the innermost layer at the bent portion increases. At least one of the layers therefore has a greater risk of being damaged when a multilayer structure like the flexible wiring board 1B illustrated in FIG. 2 is greatly bent overall. By contrast, in the flexible wiring board 1C illustrated in FIG. 3, the multilayer structure is separated into parts. The flexible wiring board 1C illustrated in FIG. 3 therefore has a relatively small difference in distance between the outermost layer and the innermost layer in each of the separated layers even when bent. Accordingly, the risk of at least one layer being damaged is relatively low when a structure like the flexible wiring board 1C illustrated in FIG. 3 is greatly bent overall. For example, even when a portion of the flexible wiring board 1C illustrated in FIG. 3 is bent all the way around (360 degrees), the risk of at least one layer being damaged can be kept relatively low.

In the configuration illustrated in FIG. 3, however, the same configuration as strip line or a coplanar line configured on a rigid board cannot be adopted. Impedance control may therefore become impossible in the configuration illustrated in FIG. 3. Consequently, in the flexible wiring board 1C illustrated in FIG. 3, it may become impossible to transmit a high frequency signal well in the impedance control line 10.

Figure 4:
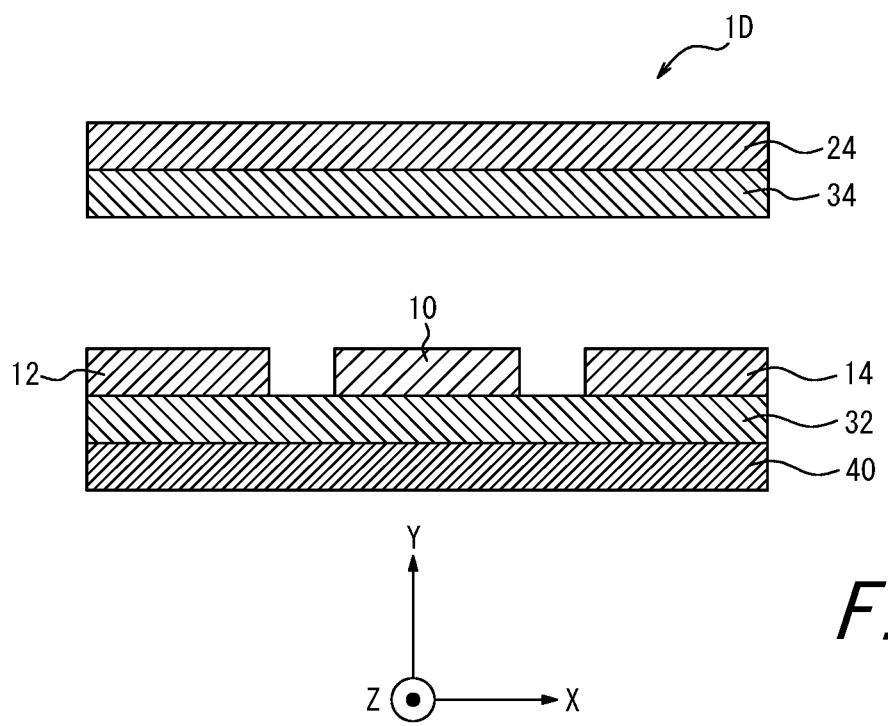
FIG. 4 illustrates a cross-section of a flexible wiring board according to an embodiment.

FIG. 4 illustrates a cross-section, parallel to the x-y plane, of a flexible wiring board 1D according to an embodiment. The flexible wiring board 1D illustrated in FIG. 4 can transmit a signal in a direction parallel to the z-axis. As illustrated in FIG. 4, the flexible wiring board 1D according to an embodiment may include a structure with at least two layers (three or two layers in FIG. 4) overlapping in the y-axis direction.

As illustrated in FIG. 4, the flexible wiring board 1D according to an embodiment may be the product of partial changes to the flexible wiring board 1C illustrated in FIG. 3. In other words, the flexible wiring board 1D illustrated in FIG. 4 may be configured like the flexible wiring board 1C illustrated in FIG. 3, but without the first ground layer 22. Furthermore, the flexible wiring board 1D illustrated in FIG. 4 may be configured like the flexible wiring board 1C illustrated in FIG. 3, with a thin film metal layer 40 further positioned below the first insulation layer 32. Here, the thin film metal layer 40 may be positioned in close contact below the first insulation layer 32, as illustrated in FIG. 4. The second insulation layer 34, on the other hand, may be apart from the impedance control line 10, the first ground line 12, and the second ground line 14, as illustrated in FIG. 4.

The thin film metal layer 40 may, for example, be a thin metal sheet. For example, the thin film metal layer 40 may be configured by a silver sheet. The thin film metal layer 40 may be a layer that functions as a ground (GND).

As described above, a structure such as a strip line cannot be adopted if the first ground layer 22 and/or the second ground layer 24 are separated from the impedance control line 10, as in the flexible wiring board 1C illustrated in FIG. 3. In the flexible wiring board 1C illustrated in FIG. 3, it may therefore become impossible to transmit a high frequency signal well in the impedance control line 10.

To address this issue, the thin film metal layer 40 that is a silver sheet or the like is used on the layers on one side in the flexible wiring board 1D illustrated in FIG. 4. A ground (GND) is formed in the flexible wiring board 1D illustrated in FIG. 4 by the thin film metal layer 40 being in close contact. Accordingly, the flexible wiring board 1D illustrated in FIG. 4 can perform impedance control by achieving a structure like a coplanar line. The characteristic impedance can therefore be stabilized in the flexible wiring board 1D illustrated in FIG. 4.

In this way, the flexible wiring board 1D according to an embodiment may include at least two layers, as illustrated in FIG. 4. For example, the flexible wiring board 1D according to an embodiment may include the impedance control line 10 that is capable of transmitting a high frequency signal. The flexible wiring board 1D according to an embodiment may also include a conductive layer including a conductor positioned along the impedance control line 10, like the thin film metal layer 40.

In this case, the impedance control line 10 may be positioned to run in parallel with a conductor like the thin film metal layer 40, as illustrated in FIG. 4. The layer including the impedance control line 10 and the conductive layer such as the thin film metal layer 40 may be apart from each other with the first insulation layer 32 therebetween, for example, as illustrated in FIG. 4. The layer including the impedance control line 10 may be positioned near the conductive layer such as the thin film metal layer 40 so that the conductive layer functions as a ground layer.

Figure 5:
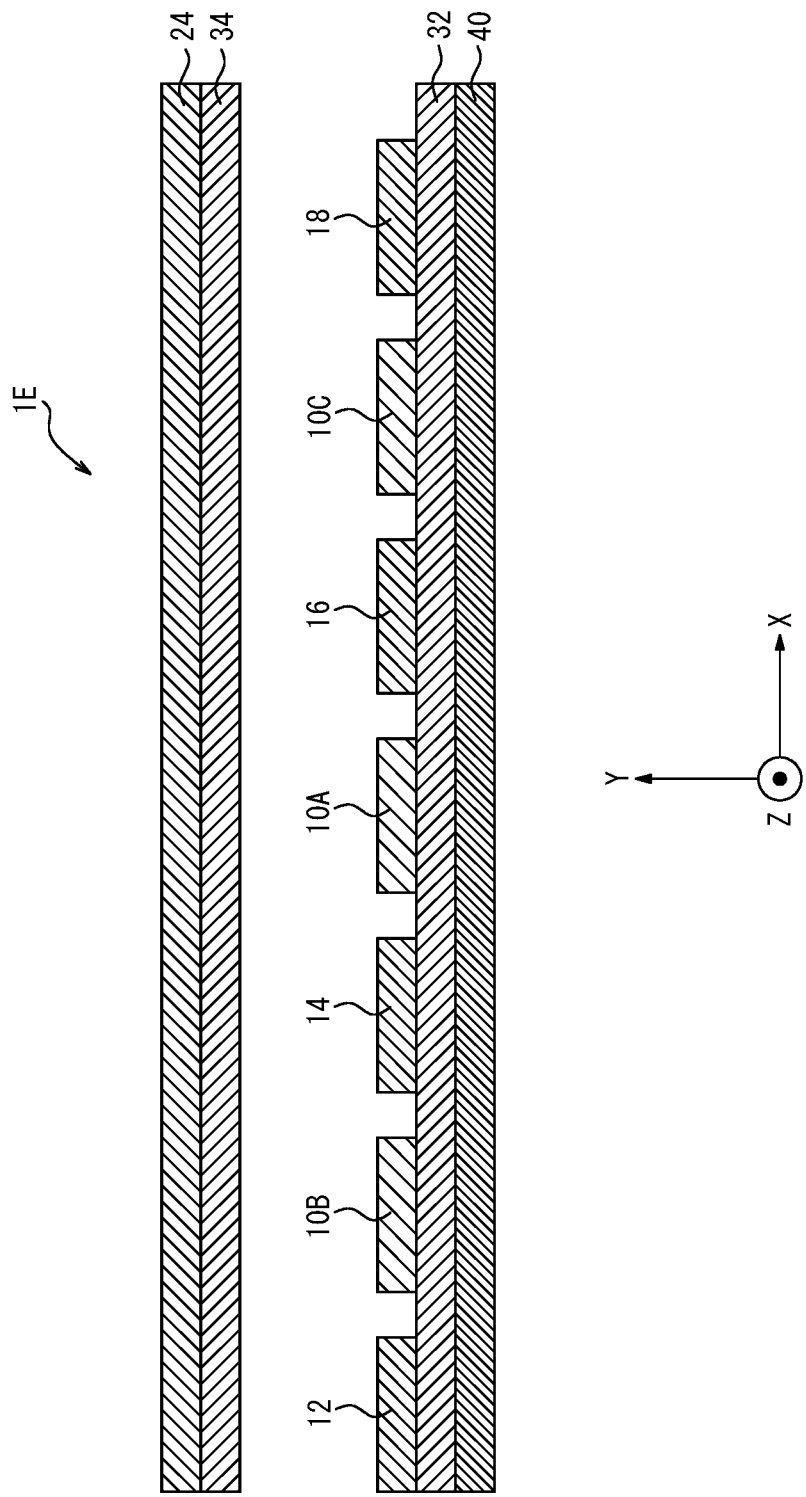
FIG. 5 illustrates a cross-section of a flexible wiring board according to an embodiment.

FIG. 5 illustrates a cross-section, parallel to the x-y plane, of a flexible wiring board 1E according to an embodiment. The flexible wiring board 1E illustrated in FIG. 5 can transmit a signal in a direction parallel to the z-axis. As illustrated in FIG. 5, the flexible wiring board 1E according to an embodiment may include a structure with at least two layers (three or two layers in FIG. 4) overlapping in the y-axis direction.

As illustrated in FIG. 5, the flexible wiring board 1E according to an embodiment may be the product of partial changes to the flexible wiring board 1D illustrated in FIG. 4. In other words, the configuration and arrangement of the first insulation layer 32 and the thin film metal layer 40 in the flexible wiring board 1E illustrated in FIG. 5 may be similar to those of the flexible wiring board 1D illustrated in FIG. 4. The configuration and arrangement of the second ground layer 24 and the second insulation layer 34 in the flexible wiring board 1E illustrated in FIG. 5 may be similar to those of the flexible wiring board 1D illustrated in FIG. 4.

On the other hand, the flexible wiring board 1E illustrated in FIG. 5 may include an impedance control line 10A, an impedance control line 10B, and an impedance control line 10C. The configuration of each of these impedance control lines 10A, 10B, 10C may be similar to that of the impedance control line 10 of the flexible wiring board 1D illustrated in FIG. 4. As illustrated in FIG. 5, the impedance control line 10B may be disposed on the left side of the impedance control line 10A. As illustrated in FIG. 5, the impedance control line 10C may be disposed on the right side of the impedance control line 10A.

The flexible wiring board 1E illustrated in FIG. 5 may include a first ground line 12, a second ground line 14, a third ground line 16, and a fourth ground line 18. The configurations of the first through fourth ground lines 12 through 18 may each be similar to that of the first ground line 12 or the second ground line 14 of the flexible wiring board 1D illustrated in FIG. 4. As illustrated in FIG. 5, the impedance control line 10B may be positioned between the first ground line 12 and the second ground line 14. As illustrated in FIG. 5, the impedance control line 10A may be positioned between the second ground line 14 and the third ground line 16. As illustrated in FIG. 5, the impedance control line 10C may be positioned between the third ground line 16 and the fourth ground line 18.

As illustrated in FIG. 5, the flexible wiring board 1E includes a plurality of impedance control lines, i.e. the impedance control line 10A, the impedance control line 10B, and the impedance control line 10C. In this case, the impedance control line disposed in the center of the flexible wiring board 1E may be a line for transmitting a higher frequency signal. The impedance control lines not disposed in the center of the flexible wiring board 1E may be lines for transmitting lower frequency signals. The "center" of the flexible wiring board 1E here may refer to the center in the x-axis direction illustrated in FIG. 5. In other words, in the flexible wiring board 1E illustrated in FIG. 5, the highest frequency signal may be transmitted on the impedance control line 10A. On the other hand, in the flexible wiring board 1E illustrated in FIG. 5, lower frequency signals than the frequency signal transmitted on the impedance control line 10A may be transmitted on the impedance control lines 10B and 10C. By transmitting signals in this way, the flexible wiring board 1E can stabilize the impedance.

When the flexible wiring board 1E is viewed from above, for example, as illustrated in FIG. 5, the impedance control line 10A and the like may be disposed to be included in an area corresponding to the position where the thin film metal layer 40 is located. In other words, the impedance control line 10A and the like may be disposed so that an orthogonal projection of the impedance control line 10A and the like onto the thin film metal layer 40 is included in the thin film metal layer 40.

In this case, the impedance control line 10A may be positioned so that an orthogonal projection of the impedance control line 10A onto the thin film metal layer 40 passes through the center of the thin film metal layer 40 or near the center of the thin film metal layer 40, as illustrated in FIG. 5. The impedance control line 10A may, in this case, transmit a higher frequency signal than the signals transmitted on the impedance control lines 10B, 10C. In other words, the layer including the impedance control line 10A may include a signal line (such as the impedance control lines 10B, 10C) configured to transmit a lower frequency signal than the high frequency signal transmitted on the impedance control line 10A.

As described above, in the flexible wiring board 1E according to an embodiment, the layer including the impedance control line 10A may include a conductor that runs in parallel with the impedance control line 10A. Here, the conductor that runs in parallel with the impedance control line 10A may, for example, include at least one of the second ground line 14 and the third ground line 16, as illustrated in FIG. 5. The conductor that runs in parallel with the impedance control line 10A may, for example, include at least one of the impedance control line 10B and the impedance control line 10C, as illustrated in FIG. 5.

Furthermore, a plurality of flexible wiring boards 1E illustrated in FIG. 5 may be arranged in overlap in the y-axis direction, i.e. the vertical direction. In this way, the flexible wiring board 1E according to an embodiment may include a plurality of conductive layers such as the layer including the impedance control line 10 and the thin film metal layer 40 (or the second ground layer 24).

As described above, an impedance control line can be formed according to a configuration such as that of the flexible wiring board illustrated in FIG. 5, for example. A high frequency signal, such as an RF signal, can therefore be transmitted well by a configuration such as that of the flexible wiring board 1E. Furthermore, flexibility or bendability can be provided overall by a configuration such as that of the flexible wiring board 1E. Structural constraints on the housing or the like for mounting the flexible wiring board 1E can therefore flexibly be addressed by a configuration such as that of the flexible wiring board 1E.

Next, a flexible wiring board (flexible wiring board 1) such as the flexible wiring board 1D illustrated in FIG. 4 or the flexible wiring board 1E illustrated in FIG. 5 is further described.

Figure 6:
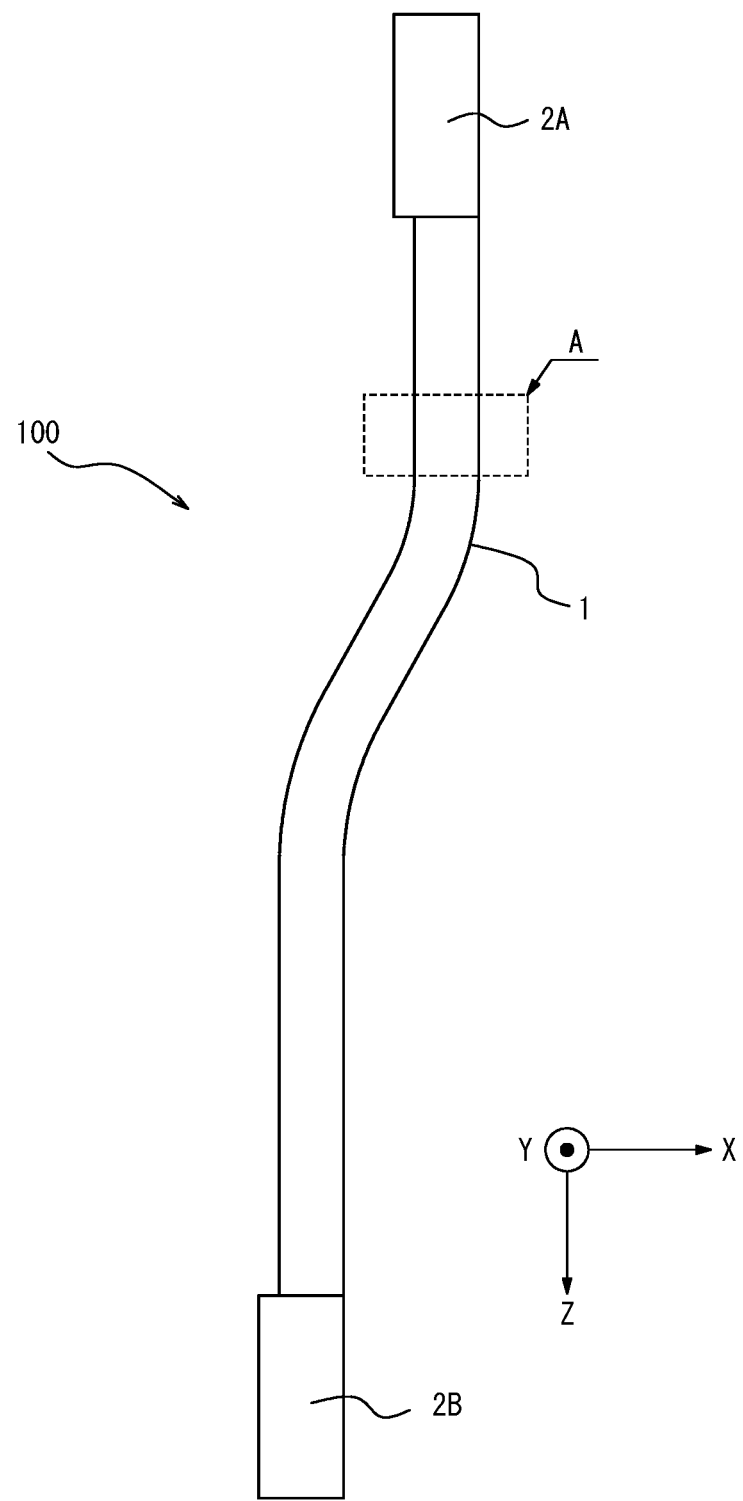
FIG. 6 illustrates the appearance of a flexible wiring board according to an embodiment.

FIG. 6 schematically illustrates the appearance of the flexible wiring board 1. FIG. 6 illustrates the state of the flexible wiring board 1 from above in plan view. The flexible wiring board 1 illustrated in FIG. 6 is illustrated in an unbent state.

As illustrated in FIG. 6, the ends of the flexible wiring board 1 are respectively connected to a connection board 2A and a connection board 2B. The connection board 2A and connection board 2B may each be a rigid board, for example. As illustrated in FIG. 6, the flexible wiring board 1, together with the connection board 2A and the connection board 2B, may configure a flexible wiring board 100 for a hinge, for example. The flexible wiring board 100 for a hinge can, for example, be used in an opening/closing portion of a clamshell housing, such as a feature phone. In this case, the flexible wiring board 1 can transmit high frequency signals well while maintaining flexibility or bendability.

FIGS. 7 through 12 schematically illustrate some of the layers forming the flexible wiring board 1 illustrated in FIG. 6. FIGS. 7 through 12 illustrate the layers in the portion surrounded by dashed lines in the flexible wiring board illustrated in FIG. 6 in order from top to bottom or bottom to top.

Figure 7:
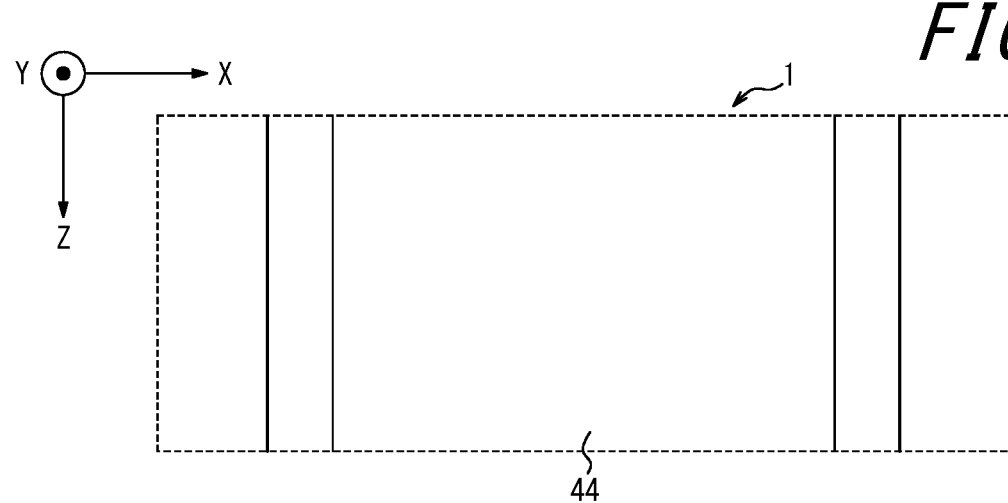
FIG. 7 illustrates a layer in a multilayer structure of a flexible wiring board according to an embodiment.

A second silver sheet 44 illustrated in FIG. 7 may, for example, be a first layer (silver sheet layer) in the flexible wiring board 1 illustrated in FIG. 6. Here, the second silver sheet 44 may be configured in the same way as the thin film metal layer 40 illustrated in FIG. 4, for example. The second silver sheet 44 may, for example, be the conductive layer of the uppermost layer or lowermost layer in the flexible wiring board 1, excluding the insulation layer and the adhesive layer.

Figure 8:
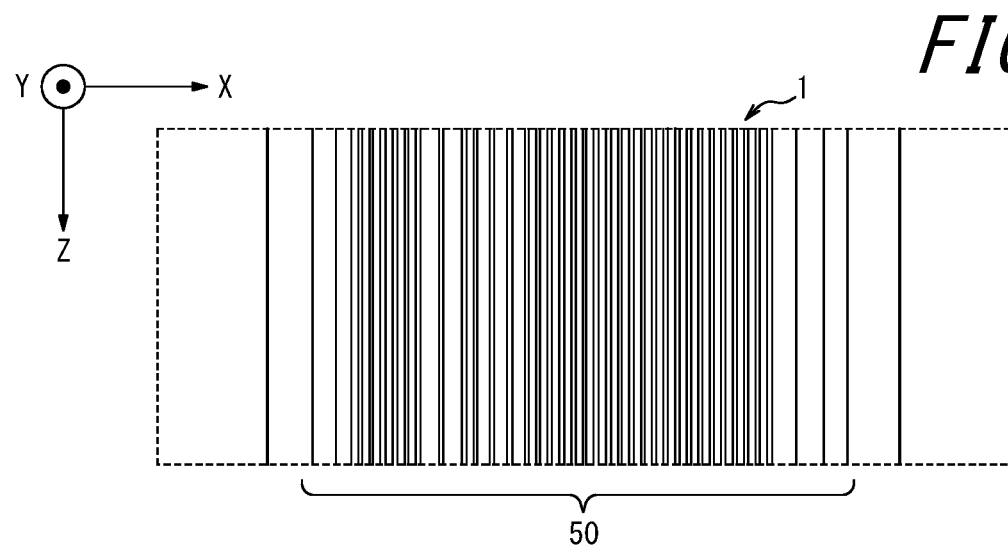
FIG. 8 illustrates a layer in a multilayer structure of a flexible wiring board according to an embodiment.

A control line 50 illustrated in FIG. 8 may be included in a second layer (control line layer) in the flexible wiring board 1 illustrated in FIG. 6, for example. As illustrated in FIG. 8, the control line 50 may be a set of a plurality of lines. Any appropriate number and size of lines may be included in accordance with various specifications.

Figure 9:
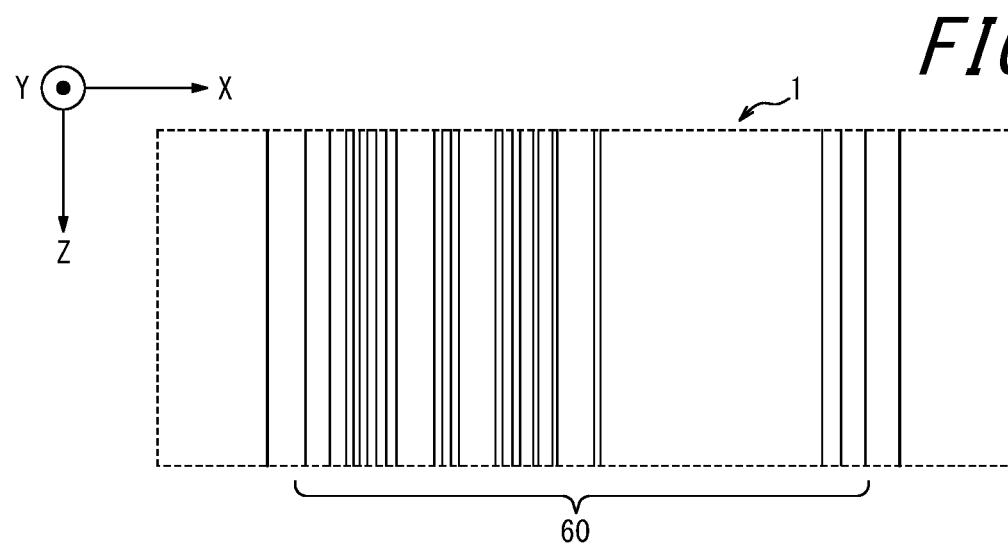
FIG. 9 illustrates a layer in a multilayer structure of a flexible wiring board according to an embodiment.

A power supply line 60 illustrated in FIG. 9 may be included in a third layer (power source layer) in the flexible wiring board 1 illustrated in FIG. 6, for example. As illustrated in FIG. 9, the power supply line 60 may be a set of a plurality of lines. Any appropriate number and size of lines may be included in accordance with various specifications.

Figure 10:
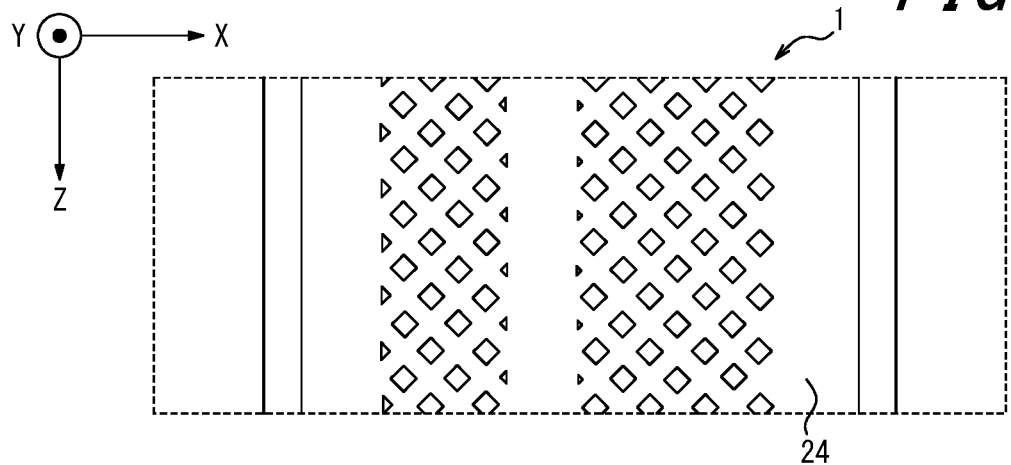
FIG. 10 illustrates a layer in a multilayer structure of a flexible wiring board according to an embodiment.

A second ground layer 24 illustrated in FIG. 10 may be included in a fourth layer (ground layer) in the flexible wiring board 1 illustrated in FIG. 6, for example. The second ground layer 24 illustrated in FIG. 10 may, for example, be configured in the same way as the second ground layer 24 illustrated in FIG. 4 or FIG. 5.

Figure 11:
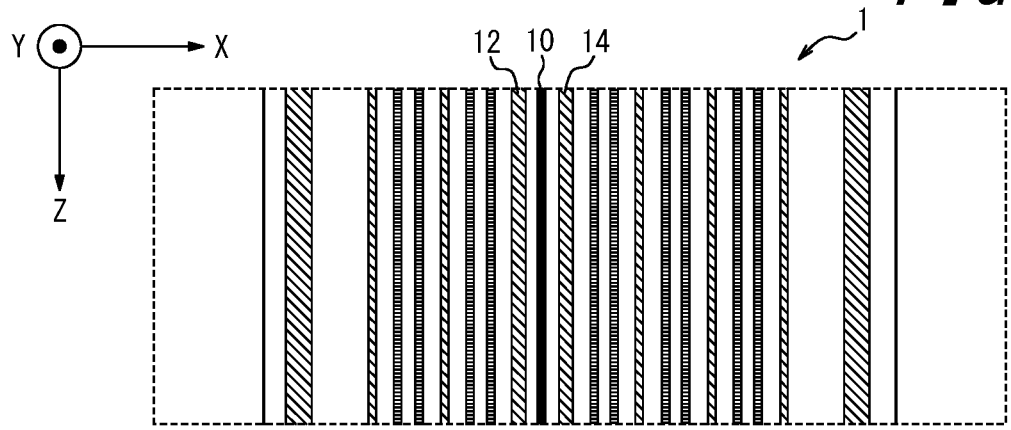
FIG. 11 illustrates a layer in a multilayer structure of a flexible wiring board according to an embodiment.

An impedance control line 10 and a first ground line 12 and second ground line 14 illustrated in FIG. 11 may be included in a fifth layer (strip line layer) in the flexible wiring board 1 illustrated in FIG. 6, for example. The impedance control line 10 and the first ground line 12 and second ground line 14 illustrated in FIG. 11 may be configured like the corresponding components described in FIG. 5. For example, the impedance control line 10 illustrated in FIG. 11 may be configured like the impedance control line 10A illustrated in FIG. 5. The first ground line 12 illustrated in FIG. 11, for example, may be configured like the second ground line 14 illustrated in FIG. 5. The second ground line 14 illustrated in FIG. 11 may be configured like the third ground line 16 illustrated in FIG. 5. The fifth layer illustrated in FIG. 11 may include an impedance control line such as at least one of the impedance control line 10B and the impedance control line 10C illustrated in FIG. 5.

Figure 12:
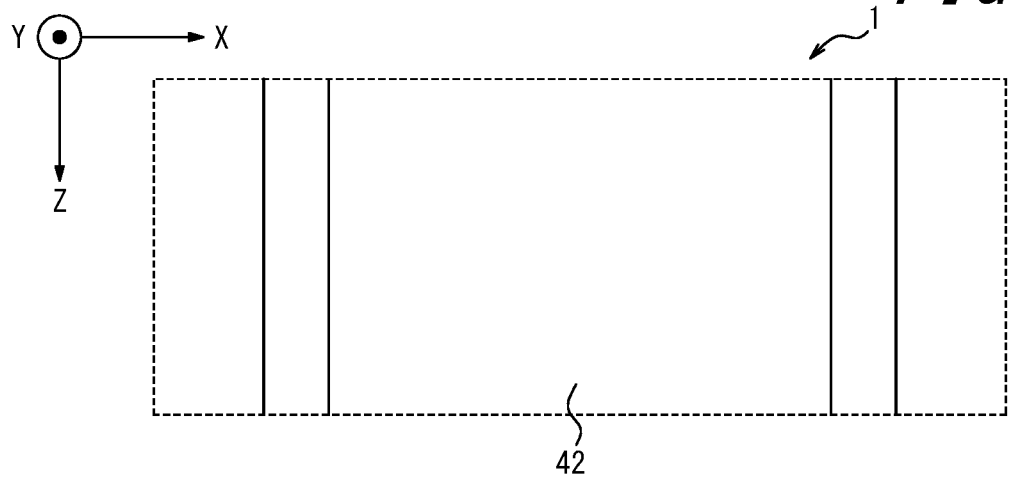
FIG. 12 illustrates a layer in a multilayer structure of a flexible wiring board according to an embodiment.

A first silver sheet 42 illustrated in FIG. 12 may, for example, be a sixth layer (silver sheet layer) in the flexible wiring board 1 illustrated in FIG. 6. Here, the first silver sheet 42 may be configured in the same way as the thin film metal layer 40 illustrated in FIG. 4, for example. The first silver sheet 42 may, for example, be the conductive layer of the lowermost layer or uppermost layer in the flexible wiring board 1, excluding the insulation layer and the adhesive layer.

As described above, the flexible wiring board 1 may include a plurality of conductive layers such as the ground layer that includes the conductor running in parallel with the impedance control line 10.

Although the present disclosure has been described with reference to the accompanying drawings and examples, it is to be noted that various changes and modifications will be apparent to those skilled in the art based on the present disclosure. Therefore, such changes and modifications are to be understood as included within the scope of the present disclosure. For example, the functions and the like included in the various functional components, means, and steps may be reordered in any logically consistent way. Furthermore, functional components or steps may be combined into one or divided. The above embodiments of the present disclosure are not limited to being implemented precisely as described and may be implemented by combining or partially omitting the features thereof.

The invention claimed is:

1. A flexible wiring board comprising:
at least one layer including an impedance control line capable of transmitting a high frequency signal, the impedance control line being a central line in a width direction of the flexible wiring board;
first and second ground lines on opposite sides of the impedance control line and separated from the impedance control line by respective gaps without any insulation;
at least one conductive layer including a conductor positioned along the impedance control line; and
an arrangement of groups of a plurality of additional impedance control lines between two ground lines on opposite sides of the impedance control line.

2. The flexible wiring board of claim 1, wherein the impedance control line is positioned to run in parallel with the conductor.

3. The flexible wiring board of claim 1, wherein the at least one layer including the impedance control line and the at least one conductive layer are positioned apart from each other.

4. The flexible wiring board of claim 1, wherein the at least one layer including the impedance control line is positioned near the at least one conductive layer so that the at least one conductive layer functions as a ground layer.

5. The flexible wiring board of claim 1, wherein the impedance control line is disposed so that an orthogonal projection of the impedance control line onto the conductor is included in the conductor.

6. The flexible wiring board of claim 5, wherein the impedance control line is positioned so that an orthogonal projection of the impedance control line onto the conductor passes through a center of the conductor or near the center of the conductor.

7. The flexible wiring board of claim 1, wherein the at least one layer including the impedance control line includes a signal line configured to transmit a signal of a lower frequency than the high frequency signal.

8. The flexible wiring board of claim 1, further comprising a plurality of conductive layers including a conductor running in parallel with the impedance control line.

9. The flexible wiring board of claim 1, wherein the at least one layer including the impedance control line includes a conductor running in parallel with the impedance control line.

10. The flexible wiring board of claim 1, wherein the at least one layer including the impedance control line includes a plurality of layers including the impedance control line, and the at least one conductive layer includes a plurality of conductive layers.

11. The flexible wiring board of claim 1, further comprising:
the at least one conductive layer includes a second conductor having openings therein and positioned along the impedance control line.

* * * * *